United States Patent
Hoang et al.

(10) Patent No.: US 9,362,105 B2
(45) Date of Patent: Jun. 7, 2016

(54) PRE-CUT WAFER APPLIED UNDERFILL FILM ON DICING TAPE

(71) Applicant: Henkel IP & Holding GmbH, Duesseldorf (DE)

(72) Inventors: Gina Hoang, Garden Grove, CA (US); YounSang Kim, Irvine, CA (US); Rose Guino, Irvine, CA (US)

(73) Assignee: Henkel IP & Holding GmbH, Duesseldorf (DE)

( * ) Notice: Subject to any disclaimer, the term of this patent is extended or adjusted under 35 U.S.C. 154(b) by 0 days.

(21) Appl. No.: 13/799,657

(22) Filed: Mar. 13, 2013

(65) Prior Publication Data
US 2013/0196472 A1 Aug. 1, 2013

Related U.S. Application Data

(63) Continuation of application No. PCT/US2012/023068, filed on Jan. 30, 2012.

(60) Provisional application No. 61/438,341, filed on Feb. 1, 2011.

(51) Int. Cl.
*H01L 21/02* (2006.01)
*H01L 21/56* (2006.01)
(Continued)

(52) U.S. Cl.
CPC ........ *H01L 21/02002* (2013.01); *H01L 21/561* (2013.01); *H01L 21/563* (2013.01); *H01L 21/6836* (2013.01); *H01L 24/27* (2013.01); *H01L 24/92* (2013.01); *H01L 24/94* (2013.01); *H01L 24/16* (2013.01); *H01L 24/29* (2013.01); *H01L 24/81* (2013.01); *H01L 2221/6834* (2013.01); *H01L 2221/68327* (2013.01); *H01L 2221/68377* (2013.01);
(Continued)

(58) Field of Classification Search
USPC .................................. 438/118, 759
See application file for complete search history.

(56) References Cited

U.S. PATENT DOCUMENTS

| 4,208,005 A | 6/1980 | Nate et al. |
| 5,045,921 A | 9/1991 | Lin et al. |

(Continued)

FOREIGN PATENT DOCUMENTS

| CN | 101339910 A | 1/2009 | |
| EP | 1381076 A2 * | 1/2004 | ............ H01L 21/00 |

(Continued)

OTHER PUBLICATIONS

RC-800 Series, Pulsed UV Curing Systems. Brochure, Xenon Corporation, 2006, Wilmington, MA, USA.
(Continued)

*Primary Examiner* — Jarrett Stark
*Assistant Examiner* — Charles N Ausar-El
(74) *Attorney, Agent, or Firm* — James J. Cummings

(57) ABSTRACT

A method for preparing a semiconductor with preapplied underfill comprises (a) providing a thinned silicon semiconductor wafer having a plurality of metallic bumps on its active face and, optionally, through-silica-vias vertically through the silicon semiconductor wafer; (b) providing an underfill material on a dicing support tape, in which the underfill material is precut to the shape of the semiconductor wafer; (c) aligning the underfill material on the dicing support tape with the semiconductor wafer and laminating the underfill material to the semiconductor wafer.

12 Claims, 2 Drawing Sheets

Inventive Method

(51) Int. Cl.
*H01L 21/683* (2006.01)
*H01L 23/00* (2006.01)

(52) U.S. Cl.
CPC ........... *H01L 2224/16227* (2013.01); *H01L 2224/27002* (2013.01); *H01L 2224/27003* (2013.01); *H01L 2224/27436* (2013.01); *H01L 2224/2919* (2013.01); *H01L 2224/29191* (2013.01); *H01L 2224/73104* (2013.01); *H01L 2224/81815* (2013.01); *H01L 2224/9212* (2013.01); *H01L 2224/94* (2013.01)

(56) References Cited

U.S. PATENT DOCUMENTS

| | | | |
|---|---|---|---|
| 5,356,947 | A | 10/1994 | Ali et al. |
| 5,635,010 | A | 6/1997 | Pepe et al. |
| 5,681,757 | A | 10/1997 | Hayes |
| 6,260,264 | B1 | 7/2001 | Chen et al. |
| 6,465,330 | B1* | 10/2002 | Takahashi et al. ............ 438/464 |
| 6,534,387 | B1 | 3/2003 | Shinogi et al. |
| 6,794,751 | B2* | 9/2004 | Kumamoto ................... 257/738 |
| 6,958,298 | B2* | 10/2005 | Murayama ................... 438/759 |
| 7,071,572 | B2* | 7/2006 | Kumamoto ................... 257/778 |
| 7,074,695 | B2 | 7/2006 | Park et al. |
| 7,176,044 | B2 | 2/2007 | Forray et al. |
| 7,455,095 | B2 | 11/2008 | Yamamoto |
| 7,468,292 | B2 | 12/2008 | Yamano |
| 7,473,617 | B2 | 1/2009 | Momoi et al. |
| 7,482,251 | B1 | 1/2009 | Paulsen et al. |
| 7,488,993 | B2 | 2/2009 | Tokano et al. |
| 7,491,772 | B2 | 2/2009 | Kamiya et al. |
| 7,494,845 | B2 | 2/2009 | Hwang et al. |
| 7,494,900 | B2 | 2/2009 | Harris et al. |
| 7,495,315 | B2 | 2/2009 | Lee et al. |
| 7,498,520 | B2 | 3/2009 | Osaka et al. |
| 7,501,300 | B2 | 3/2009 | Abe |
| 7,560,519 | B2 | 7/2009 | Canelas et al. |
| 7,727,875 | B2* | 6/2010 | Shin et al. ................... 438/613 |
| 7,811,903 | B2* | 10/2010 | Grigg ................... H01L 21/563 438/108 |
| 8,106,522 | B2* | 1/2012 | Sato et al. ................... 257/783 |
| 8,648,476 | B2* | 2/2014 | Takamoto et al. ............ 257/783 |
| 8,692,389 | B2* | 4/2014 | Takamoto et al. ............ 257/778 |
| 8,703,584 | B2* | 4/2014 | Misumi et al. ................ 438/464 |
| 8,704,366 | B2* | 4/2014 | Shin ........................ H01L 21/78 257/737 |
| 8,766,462 | B2* | 7/2014 | Takamoto et al. ............ 257/783 |
| 2001/0040298 | A1 | 11/2001 | Baba et al. |
| 2002/0166625 | A1* | 11/2002 | Ball et al. ..................... 156/247 |
| 2002/0197771 | A1 | 12/2002 | Dotta et al. |
| 2003/0017663 | A1 | 1/2003 | Takyu et al. |
| 2003/0022465 | A1 | 1/2003 | Wachtler |
| 2003/0034128 | A1* | 2/2003 | Matsumura ........ H01L 21/563 156/330.9 |
| 2003/0129438 | A1 | 7/2003 | Becker et al. |
| 2004/0007327 | A1* | 1/2004 | Kobayashi ................... 156/353 |
| 2004/0185601 | A1 | 9/2004 | Stepniak et al. |
| 2004/0266940 | A1 | 12/2004 | Issari |
| 2005/0003636 | A1 | 1/2005 | Takyu et al. |
| 2005/0014313 | A1 | 1/2005 | Workman et al. |
| 2005/0074547 | A1* | 4/2005 | Morganelli et al. ............ 427/58 |
| 2005/0126686 | A1* | 6/2005 | Cheong et al. ................ 156/153 |
| 2005/0181540 | A1 | 8/2005 | Farnworth et al. |
| 2005/0260829 | A1* | 11/2005 | Uematsu et al. .............. 438/460 |
| 2006/0046433 | A1 | 3/2006 | Sterrett et al. |
| 2006/0177954 | A1* | 8/2006 | Jeong et al. ..................... 438/33 |
| 2006/0205182 | A1 | 9/2006 | Soejima |
| 2007/0000595 | A1 | 1/2007 | Prack |
| 2007/0087532 | A1 | 4/2007 | Bauer et al. |
| 2007/0137782 | A1 | 6/2007 | Matsumura et al. |
| 2007/0155047 | A1 | 7/2007 | Jayaraman et al. |
| 2007/0241436 | A1 | 10/2007 | Ookubo et al. |
| 2007/0259515 | A1 | 11/2007 | Paik et al. |
| 2008/0003719 | A1* | 1/2008 | Lu et al. ....................... 438/113 |
| 2008/0027199 | A1 | 1/2008 | Mazurek et al. |
| 2008/0064188 | A1* | 3/2008 | Hayashi .................. H01L 21/78 438/464 |
| 2008/0157303 | A1 | 7/2008 | Yang |
| 2008/0176167 | A1 | 7/2008 | Kawamori et al. |
| 2008/0220591 | A1 | 9/2008 | Nakamura |
| 2008/0280422 | A1 | 11/2008 | Shin et al. |
| 2009/0075429 | A1* | 3/2009 | Sato et al. ..................... 438/118 |
| 2009/0166863 | A1* | 7/2009 | Watanabe et al. ............. 257/738 |
| 2010/0047969 | A1* | 2/2010 | Kim et al. ..................... 438/113 |
| 2010/0081235 | A1 | 4/2010 | Furumura |
| 2010/0190293 | A1 | 7/2010 | Maeda et al. |
| 2011/0198721 | A1* | 8/2011 | Yang et al. .................... 257/506 |
| 2012/0049304 | A1 | 3/2012 | Motz et al. |
| 2012/0244655 | A1 | 9/2012 | Moore et al. |

FOREIGN PATENT DOCUMENTS

| | | |
|---|---|---|
| EP | 2192611 A1 | 6/2010 |
| JP | 03039378 A | 2/1991 |
| JP | 2001176822 A | 6/2001 |
| JP | 2000299333 A | 4/2004 |
| JP | 2005320491 A | 11/2005 |
| JP | 2006319243 A | 11/2006 |
| JP | 2007016074 A | 1/2007 |
| JP | 2007100065 A | 4/2007 |
| JP | 2007158212 A1 | 6/2007 |
| JP | 2008294382 A | 12/2008 |
| JP | 2009164476 A | 7/2009 |
| KR | 20020023105 A | 3/2002 |
| KR | 100379563 B1 | 4/2003 |
| WO | 8400506 A1 | 2/1984 |
| WO | 2008094149 A1 | 8/2008 |
| WO | 2011128319 A1 | 10/2011 |

OTHER PUBLICATIONS

"If you have a problem with mercury UV curing, we have a better solution. Pulsed UV Light." Brochure, Xenon Corporation, 2006, Wilmington, MA, USA.

* cited by examiner

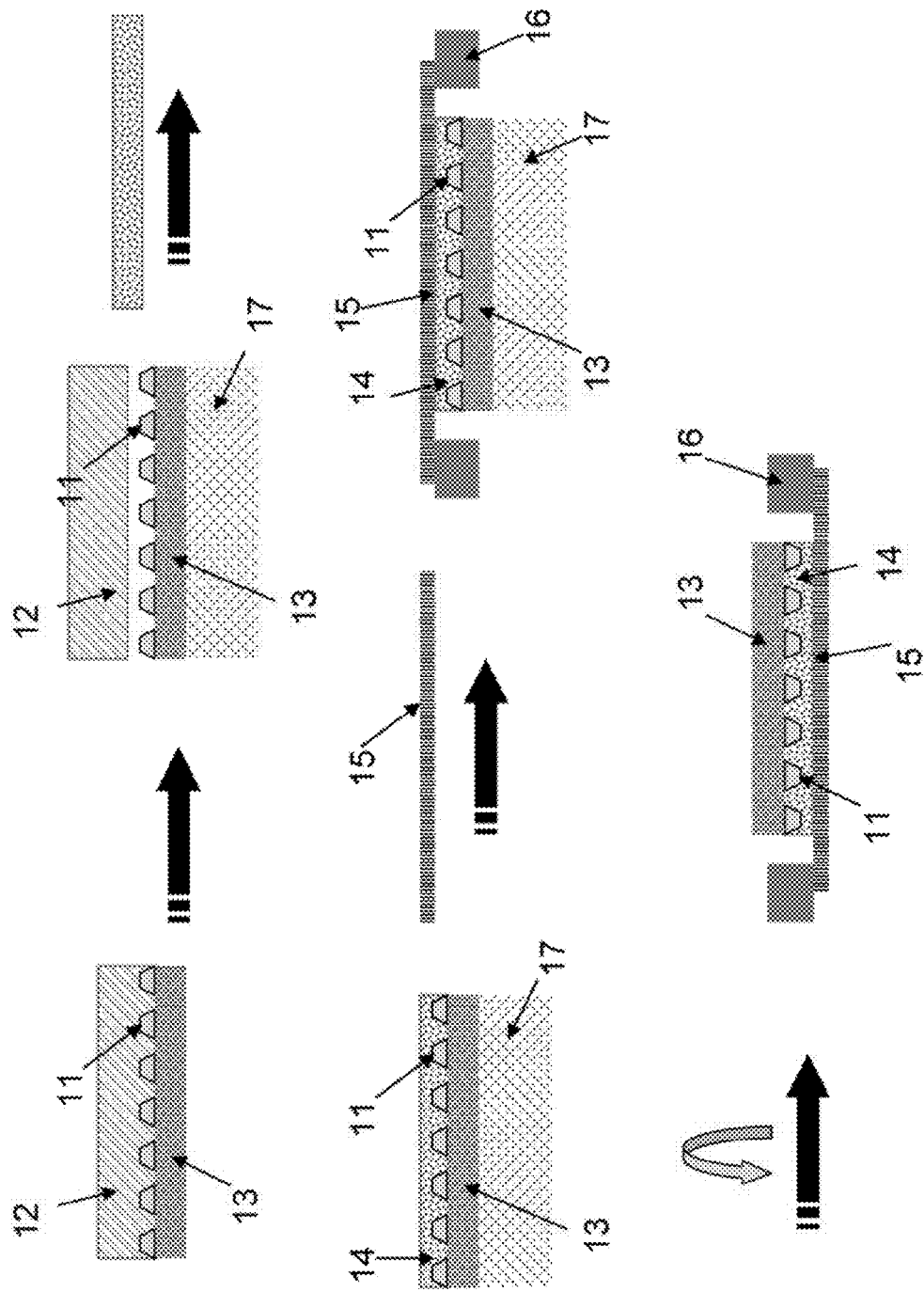

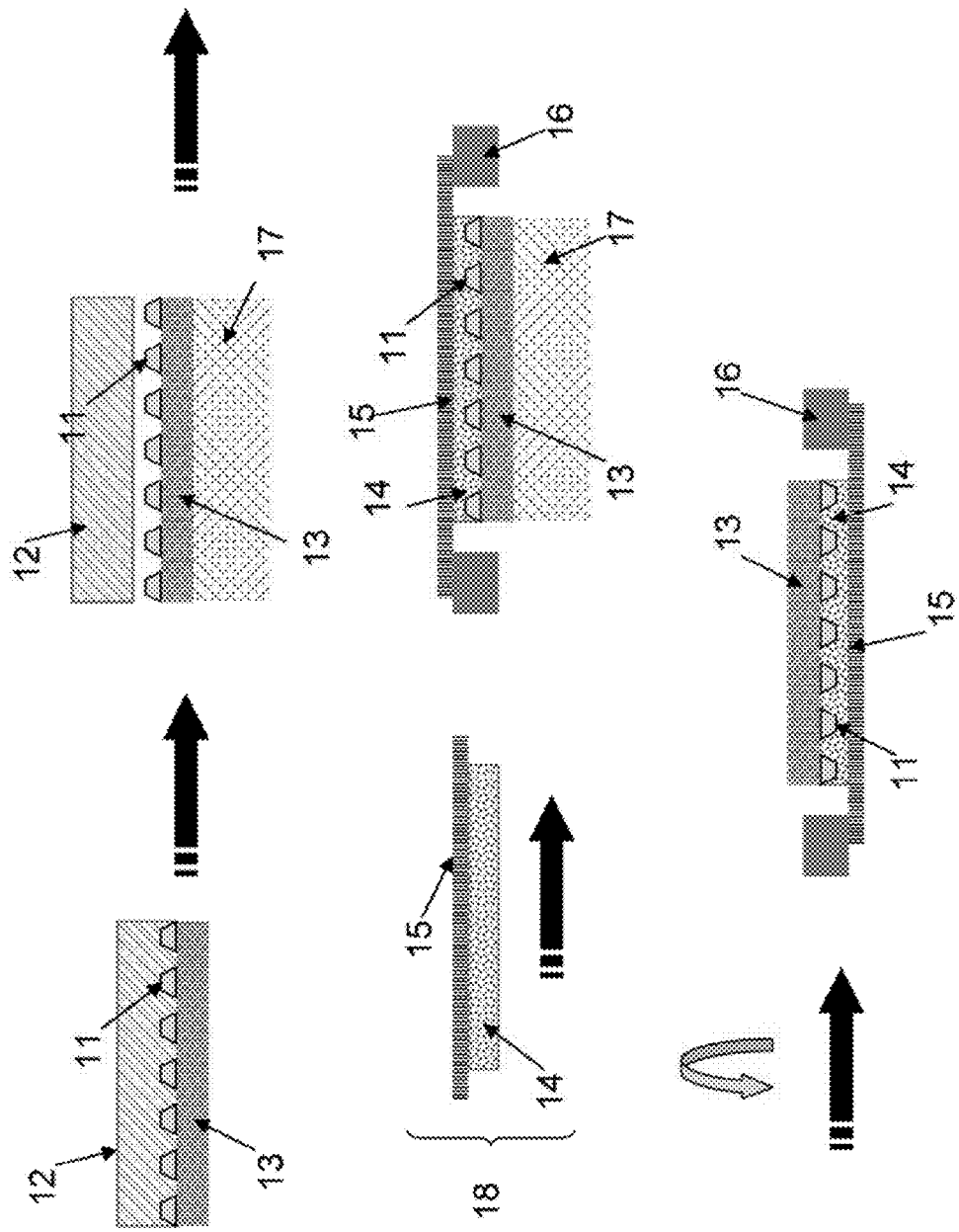

PRE-CUT WAFER APPLIED UNDERFILL FILM ON DICING TAPE

BACKGROUND OF THE INVENTION

This invention relates to a process for the fabrication of a semiconductor die.

Miniaturization and slimming of electrical and electronic equipment has led to a need for both thinner semiconductor devices and thinner semiconductor packaging. One way to accomplish this is to thin down the wafer by removing excess material from the back side of the semiconductor wafer, typically done before the wafer is diced into individual semiconductor dies.

Another solution to produce smaller and more efficient semiconductor packages is to utilize an array of metallic bumps attached to the active face of the wafer. The metallic bumps are disposed to match with bonding pads on a substrate. When the metal is reflowed to a melt, it connects with the bonding pads forming both electrical and mechanical connections. This metallic bump packaging is generally referred to as "flip chip" because the bumped semiconductors are flipped in order to be attached to their substrates.

Due to a thermal mismatch that exists between the semiconductor and the substrate, repeated thermal cycling stresses the metallic interconnections, potentially leading to ultimate device failure. To counteract this, an encapsulating material, commonly called an underfill, is disposed in the gap between the semiconductor and the substrate, surrounding and supporting the metallic bumps.

Current trends in semiconductor packaging fabrication favor completing as many process steps as possible at the wafer level, allowing multiple integrated circuits to be processed at the same time, rather than individually, as occurs after die singulation. However, thinned silicon semiconductor wafers are fragile, so it is a benefit to utilize processes in semiconductor fabrication that do not threaten the integrity of the wafer as it is being diced into individual semiconductor dies and that have as few steps as possible.

One new method for dicing semiconductor wafers into individual dies is called "stealth dicing". Stealth dicing is a dicing method in which a laser beam is irradiated to the inside of a semiconductor wafer to selected areas, thereby weakening the silicon bonds in those areas, and making it easier to divide the silicon wafer within those areas. Using stealth dicing, very thin semiconductor wafers can be cut without physically stressing the wafer, damage to the wafer is lessened, and die strength of the individual dies is not reduced. It would be an advantage to prepare a wafer for dicing so that the stealth laser dicing can be utilized.

SUMMARY OF THE INVENTION

This invention is a method for preparing for dicing a thinned semiconductor wafer with applied underfill, which method eliminates a step in conventional fabrication and is conducive to stealth dicing. The method comprises (a) providing a thinned semiconductor wafer having a plurality of metallic bumps on its active face and, optionally, through-silica-vias vertically through the silicon wafer; (b) providing an underfill material on a dicing support tape, in which the underfill material is precut to the shape of the semiconductor wafer; (c) aligning the underfill material on the dicing support tape with the semiconductor wafer and laminating the underfill material to the semiconductor wafer. In one embodiment of this method, a separation layer is disposed between the underfill and the dicing tape. In another embodiment, this invention is a dicing tape having an underfill material disposed on one side. In a further embodiment, a separation layer is disposed between the underfill and the dicing tape.

BRIEF DESCRIPTION OF THE DRAWINGS

FIG. 1 depicts a prior art method for preparing a thinned semiconductor wafer with preapplied underfill, ready for dicing.

FIG. 2 depicts the inventive method for preparing a thinned semiconductor wafer with preapplied underfill, ready for dicing, with some additional preparation steps.

DETAILED DESCRIPTION OF THE INVENTION

This invention is a method for the preparation of a semiconductor wafer for dicing. The semiconductor wafer has a plurality of metallic bumps on its active face. The essence of this invention is the use of a dicing tape having an underfill material disposed on one side. The dicing tape/underfill thus supplies the underfill material and the dicing tape in one step. Rather than applying an underfill material to the semiconductor wafer, and in a separate step, mounting the dicing tape over the underfill, the use of the combined dicing tape and underfill eliminates a step in the fabrication process. The assembly of dicing tape, underfill and wafer can be disposed in a dicing frame so that the inactive face of the wafer is oriented upwards, for ease in stealth dicing.

The wafer is prepared according to known methods from a semiconductor material, typically silicon, gallium arsenide, germanium, or similar compound semiconductor materials. The formation of the plurality of metallic bumps on the top side of the wafer, and their metallic composition, are made according to semiconductor and metallic fabrication methods well documented in industry literature. The metallic bumps are disposed on one face of the semiconductor wafer, called the active face, to match with metal bonding pads on a substrate for the semiconductor. When the metal is reflowed to a melt, it connects with the bonding pads forming both electrical and mechanical connections.

Silicon-through-vias are vertical passageways extending completely through the silicon wafer for the purpose of connecting circuitry from one semiconductor wafer to another semiconductor wafer or to a substrate for the semiconductor.

Dicing tapes are used in the fabrication process to support the wafer during dicing operations, that is, during the dicing of a semiconductor wafer into individual semiconductor dies. Dicing tapes are commercially available from a number of sources and in various forms can consist of a heat sensitive, pressure sensitive, or UV sensitive adhesive on a carrier. The carrier is typically a flexible substrate of polyolefin or polyimide. When heat, pulling strain, or UV is applied, respectively, the adhesiveness decreases, allowing the dicing tape to be removed. Commonly, a release liner covers the adhesive layer and can be easily removed just prior to use of the dicing tape.

Protective support tapes or carriers are used in the fabrication process to protect and support the metallic bumps and active face of the wafer during the wafer thinning (or back grinding) process. In some fabrication methods, the protective support can be a glass sheet or slide, another silicon wafer, or a tape suited for back grinding. Back grinding tapes are commercially available from a number of sources and in various forms consist of a heat sensitive, pressure sensitive, or UV sensitive adhesive on a carrier. The carrier is typically a flexible substrate of polyolefin or polyimide. When heat, pulling strain, or UV is applied respectively, the adhesiveness decreases, allowing the protective support tape to be removed. Commonly, a release liner covers the adhesive layer and can be easily removed just prior to use of the protective support. The back grinding operation may be performed, for example, by mechanical grinding, laser grinding, or etching.

Adhesives and encapsulants suitable as underfill chemistry that can be in the form of films are known, as are methods for making the underfill films. Suitable underfill films may be prepared, for example, from epoxy, acrylate, or silicon based chemistry and hardening agents for those chemistries. The thickness of the underfill material can be adjusted so that the metallic bumps can be either completely or only partially covered after lamination. In either case, the underfill material is supplied in amount and form so that it fully fills the space between the semiconductor and the intended substrate. In practice, the underfill material will be provided on a carrier and be protected with a release liner. Thus, the underfill material will be provided in a three layer form in which the first layer is a carrier, such as a flexible polyolefin or polyimide tape, the second layer is the underfill material, and the third layer is a release liner, in that order. Just before use, the release liner is removed and the underfill is typically applied when still attached to the carrier. After application of the underfill to the wafer, the carrier is removed.

In this invention, the underfill encapsulant is supplied on the dicing tape. The dicing tape can be in sheet form and comprises a substrate film and a pressure sensitive adhesive layer on one side of the substrate film. The underfill encapsulant, in a form precut to the size and shape of the wafer, is disposed on the dicing tape. A release liner is mounted over the underfill and is in contact with the underfill and those portions of the dicing tape not covered by the underfill (due to the precut shape of the underfill).

The invention is further described by reference to the Figures. In the figures, assemblies of one or more elements of dicing tape, silicon wafer, metallic bumps, underfill, and protective support can be shown with the active face of the silicon wafer (the face containing the metallic bumps) oriented up or down. The assembly can be handled in any orientation determined by the practitioner to be suitable and useful for the operation to be performed. Each of the dicing tape, back grinding tape, and underfill are shown without release liner. The dicing tape and back grinding tape are discarded after use. It will be understood by those skilled in the art that a release liner is generally used to protect the pressure sensitive adhesive of the dicing tape or back grinding tape, and that the release liner is removed just prior to use. The underfill layer laminated onto the active side of the wafer will move on to the dicing and bonding steps.

FIG. 1 depicts a prior art method for preparing a bumped semiconductor with preapplied underfill for dicing. A thinned semiconductor wafer 13, having a plurality of metallic bumps 11 and a protective support 12, is prepared. The assembly of wafer, bumps and protective support is supported, for example, on a vacuum chuck table 17, and the protective support 12 is removed. An underfill material 14 is laminated over the active face of the wafer, surrounding and encapsulating the metallic bumps 11. A dicing tape 15 is mounted over the underfill and the assembly of dicing tape, underfill, and bumped wafer is mounted in a dicing frame (or jig) 16 with the back side of the wafer oriented upwards and exposed for subsequent dicing.

FIG. 2 depicts the inventive method, and additional steps to more fully explain how the inventive method can be used. A thinned semiconductor wafer 13, having a plurality of metallic bumps 11 on one face, and a protective support 12, is prepared. The assembly of wafer, bumps and protective support is supported, for example, on a vacuum chuck table 17, and the protective support 12 is removed. A dicing tape 15 with an underfill layer 14 is prepared as a combination dicing tape/underfill 18. The underfill layer 14 is precut to the shape of the wafer. This combination dicing tape/precut underfill is disposed over the metallic bumps and active face of the semiconductor wafer 13, surrounding and encapsulating the metallic bumps 11. The assembly of dicing tape, underfill, and bumped wafer is mounted in a dicing frame 16 with the back side of the wafer oriented upwards and exposed for subsequent dicing. This orientation is suitable for stealth dicing.

Thus, in one embodiment, this invention is a method for preparing for dicing a thinned semiconductor wafer with applied precut underfill comprising: (a) providing a thinned silicon semiconductor wafer having a plurality of metallic bumps on its active face and, optionally, through-silica-vias vertically through the silicon semiconductor wafer; (b) providing an underfill material on a dicing support tape, in which the underfill material is precut to the shape of the semiconductor wafer; (c) aligning the underfill material on the dicing support tape with the semiconductor wafer and laminating the underfill material to the semiconductor wafer.

What is claimed:

1. A method for preparing for dicing a thinned semiconductor wafer with applied underfill, said method comprising:
   (a) providing a thinned semiconductor wafer having an active face and a back side, a plurality of metallic bumps on its active face and, optionally, through-vias vertically through the semiconductor wafer;
   (b) providing an article comprising an underfill material on a dicing support tape, in which the underfill material is precut to the shape of the semiconductor wafer; and
   (c) aligning the article with the thinned semiconductor wafer and laminating the underfill material to the active face to form an assembly, and
   (d) mounting the assembly to a dicing frame and exposing the back side of the thinned wafer for subsequent dicing,
   wherein the article supplies both of the underfill material and dicing support tape to the thinned semiconductor wafer in one fabrication step.

2. An underfill material precut to the size and shape of a thinned semiconductor wafer,
   wherein the underfill material is supported on a dicing tape, and a release liner is mounted over the underfill and is in contact with the underfill and a portion of the dicing tape not covered by the underfill,
   wherein upon removal of the release liner, the underfill material and dicing tape can be supplied in combination to the thinned semiconductor wafer in one fabrication step.

3. The method of claim 1 wherein said semiconductor wafer is silicon.

4. The method of claim 1 wherein said semiconductor wafer has one or more through-silica-vias vertically therethrough.

5. The method of claim 1 wherein the underfill material on a dicing support tape further comprises a release liner thereon.

6. The method of claim 1 further comprising dicing said laminated semiconductor wafer.

7. The underfill material of claim 2, further comprising a separation layer disposed between the underfill and the dicing tape.

8. A method for preparing for dicing a thinned semiconductor wafer with applied underfill, the wafer having an active face and a back side, said method comprising:

(a) aligning an article comprising an underfill material disposed on dicing support tape with a thinned semiconductor wafer and
(b) laminating the underfill material side of the article to the active face of the thinned semiconductor wafer to form an assembly and;
(c) mounting the assembly to a dicing frame and exposing the back side of the thinned wafer for subsequent dicing;
wherein said thinned semiconductor wafer has a plurality of metallic bumps on its active face and, optionally, through-vias vertically through the semiconductor wafer; and
wherein said underfill material on a dicing support tape is precut to the shape of the thinned semiconductor wafer,
wherein the article supplies both of the underfill material and dicing support tape to the thinned semiconductor wafer in one fabrication step.

9. The method of claim 8 further comprising dicing said laminated semiconductor wafer.

10. The method of claim 1 further comprising
(d) irradiating an inside portion of the laminated thinned wafer.

11. The method of claim 8 further comprising
(c) irradiating an inside portion of the laminated thinned wafer.

12. A method for preparing for dicing a thinned semiconductor wafer with applied underfill, said method consisting of:
(a) providing a thinned semiconductor wafer having an active face and a back side, a plurality of metallic bumps on its active face and, optionally, through-vias vertically through the semiconductor wafer;
(b) providing an article comprising an underfill material on a dicing support tape, in which the underfill material is precut to the shape of the semiconductor wafer; and
(c) aligning the article with the thinned semiconductor wafer and laminating the underfill material to the active face to form an assembly, and
(d) mounting the assembly to a dicing frame and exposing the back side of the thinned wafer for subsequent dicing,
wherein the article supplies both of the underfill material and dicing support tape to the thinned semiconductor wafer in one fabrication step.

* * * * *